United States Patent
Lou et al.

[11] Patent Number: 5,916,823
[45] Date of Patent: Jun. 29, 1999

[54] METHOD FOR MAKING DUAL DAMASCENE CONTACT

[75] Inventors: Chine-Gie Lou, Hsinchu Hsien; Yeur-Luen Tu, Taichung, both of Taiwan

[73] Assignee: Worldwide Semiconductor Manufacturing Corporation, Hsinchu, Taiwan

[21] Appl. No.: 09/170,859

[22] Filed: Oct. 13, 1998

[51] Int. Cl.$^6$ .............................. H01L 21/32; C25D 11/04
[52] U.S. Cl. ........................ 438/738; 438/696; 438/637; 438/724
[58] Field of Search .................................. 438/270, 271, 438/272, 714, 723, 724, 725, 696, 637

[56] References Cited

U.S. PATENT DOCUMENTS

| | | | |
|---|---|---|---|
| 5,118,384 | 6/1992 | Harmon et al. | 438/717 |
| 5,410,176 | 4/1995 | Liou et al. | 257/510 |
| 5,429,977 | 7/1995 | Lu et al. | 438/242 |
| 5,543,343 | 8/1996 | Bryant et al. | 438/448 |
| 5,548,159 | 8/1996 | Jeng | 257/634 |
| 5,567,634 | 10/1996 | Hebert et al. | 438/270 |
| 5,595,927 | 1/1997 | Chen et al. | 438/270 |
| 5,792,687 | 8/1998 | Jeng et al. | 438/255 |
| 5,811,865 | 9/1998 | Hodges et al. | 257/411 |

*Primary Examiner*—Robert Kunemund
*Assistant Examiner*—Bernadine Okoro
*Attorney, Agent, or Firm*—Christensen O'Connor Johnson & Kindness PLLC

[57] ABSTRACT

A method for forming a dual damascene structure on a substrate is disclosed. The method comprises the steps of: forming a liner oxide layer onto the substrate; forming a first low k dielectric layer atop the liner oxide layer; forming a cap oxide layer atop the first low k dielectric layer; forming a first nitride layer atop the cap oxide layer; patterning and etching the first nitride layer to form a contact opening; forming a second low k dielectric layer into the contact opening and atop the first nitride layer; forming a second nitride layer atop the second low k dielectric layer; forming a photoresist layer atop the second nitride layer; patterning and developing the photoresist layer to expose a trench opening, wherein the trench opening is of different dimension than the contact opening; forming a dual damascene opening by etching the second nitride layer and the second low k dielectric layer, using the photoresist layer as a mask, and by etching the cap oxide layer, the first low k dielectric layer and the liner oxide layer, using the first nitride layer as a mask; stripping the photoresist layer; forming oxide sidewall spacers into the dual damascene opening; and depositing a conductive layer into the dual damascene opening.

11 Claims, 3 Drawing Sheets

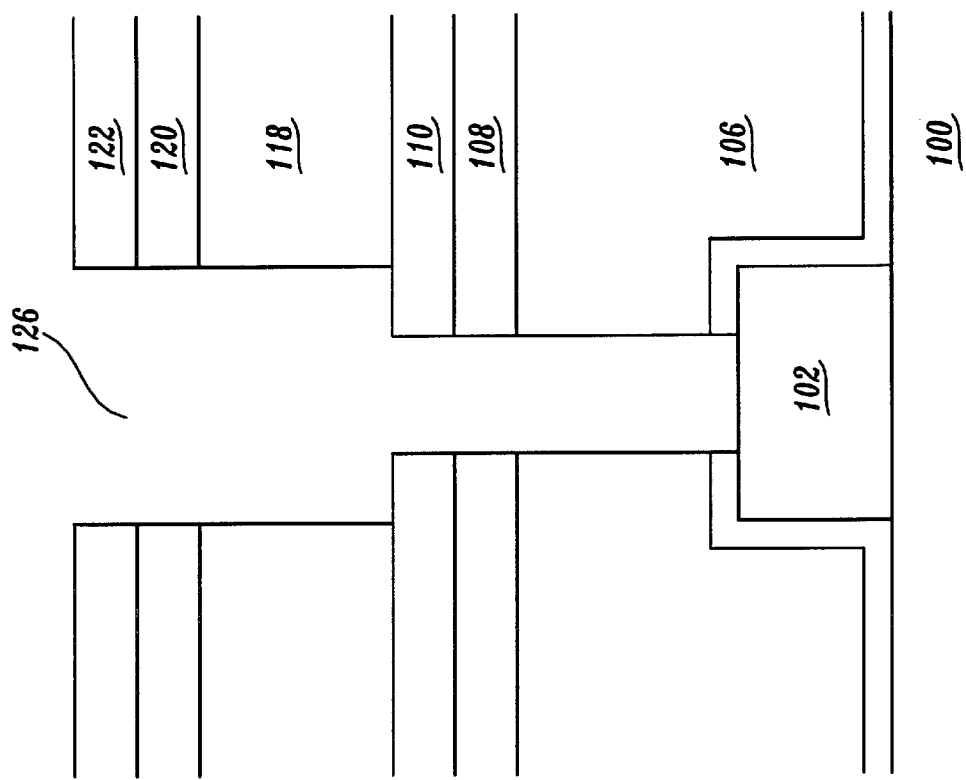
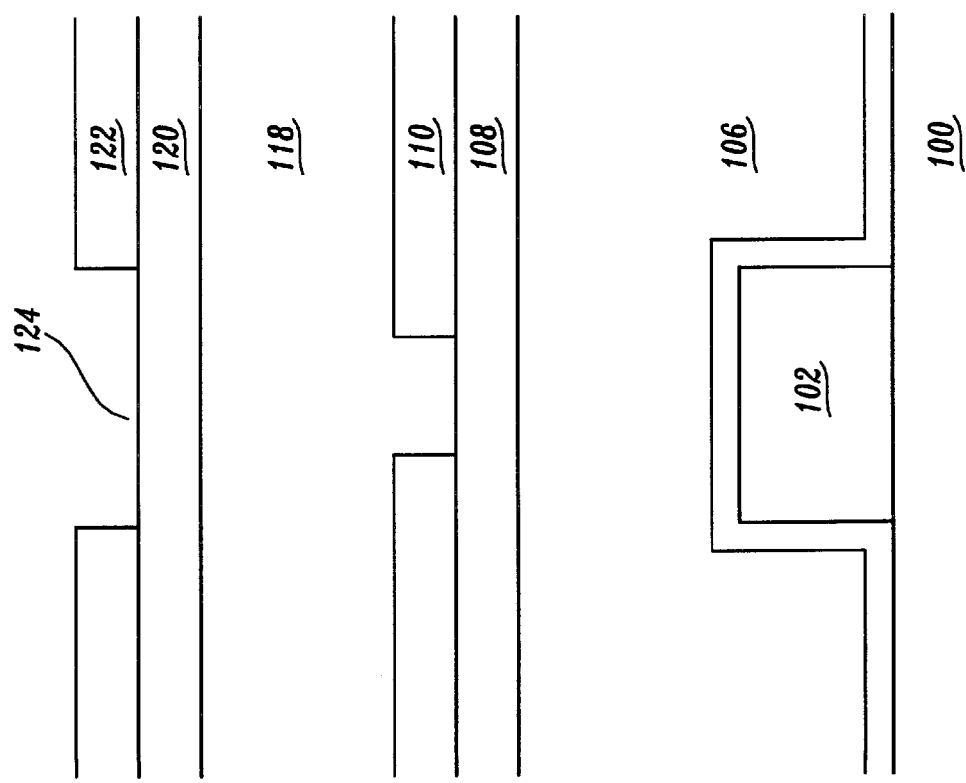

METHOD FOR MAKING DUAL DAMASCENE CONTACT

FIELD OF THE INVENTION

The present invention relates to a method for manufacturing a metal interconnect and vias, and more specifically, to a method for making a dual damascene contact.

BACKGROUND OF THE INVENTION

Damascene is an interconnection fabrication process in which grooves are formed in an insulating layer and filled with metal to form conductive lines (metal interconnects). Dual damascene is a multi-level interconnection process in which, in addition to forming the grooves of single damascene, conductive contact (or via) openings are also formed.

In the standard dual damascene process, a first oxide layer is deposited over a conductive structure. A hard mask is formed over the first oxide layer. A first patterned photoresist layer is formed on the hard mask. The hard mask is patterned using the first photoresist layer as a pattern. The first photoresist layer is removed.

A second oxide layer is then formed over the hard mask. A second patterned photoresist layer is formed over the second oxide layer. Both the first oxide layer and the second oxide layer are etched to form the dual damascene opening. The first oxide layer is etched using the hard mask as a pattern and the conductive structure as an etching stop. The second oxide layer is etched using the second photoresist layer as a pattern and the hard mask as an etching stop. The second photoresist layer is then stripped by oxygen plasma. However, the oxygen plasma damages the exposed surface of the first oxide layer and the second oxide layer within the dual damascene opening.

Therefore, there is a need for an improved method for making a dual damascene contact.

SUMMARY OF THE INVENTION

A method for forming a dual damascene structure on a substrate is disclosed. The method comprises the steps of: forming a liner oxide layer onto the substrate; forming a first low k dielectric layer atop the liner oxide layer; forming a cap oxide layer atop the first low k dielectric layer; forming a first nitride layer atop the cap oxide layer; patterning and etching the first nitride layer to form a contact opening; forming a second low k dielectric layer into the contact opening and atop the first nitride layer; forming a second nitride layer atop the second low k dielectric layer; forming a photoresist layer atop the second nitride layer; patterning and developing the photoresist layer to expose a trench opening, wherein the trench opening is of different dimension than the contact opening; forming a dual damascene opening by etching the second nitride layer and the second low k dielectric layer, using the photoresist layer as a mask, and by etching the cap oxide layer, the first low k dielectric layer and the liner oxide layer, using the first nitride layer as a mask; stripping the photoresist layer; forming oxide sidewall spacers into the dual damascene opening; and depositing a conductive layer into the dual damascene opening.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1–6 show cross-sectional views of a semiconductor substrate, illustrating the present invention for forming a dual damascene contact.

DETAILED DESCRIPTION OF THE PREFERRED EMBODIMENT

The present invention will be described in detail with reference to the accompanying drawings. The present invention provides a method for forming a dual damascene contact.

Figure 1:
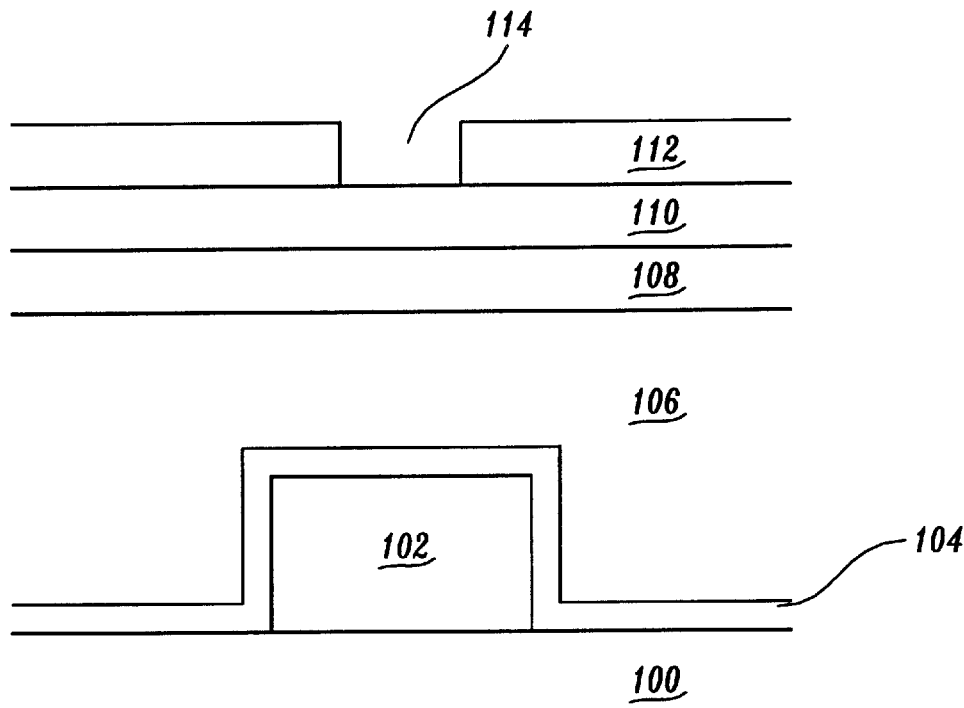

Turning to FIG. 1, a substrate 100 has a conductive structure 102 formed thereon. The term "substrate" is understood to possibly include a semiconductor wafer, active and passive devices formed within the wafer, and layers formed on the wafer's surface. Thus, the term "substrate" is meant to include devices formed within a semiconductor wafer and the layers overlying the wafer.

The conductive structure 102 is typically a metal interconnect or any other conductive structure. It can be appreciated that the conductive structure 102 shown is merely exemplary and not meant to be limiting.

In accordance with the present invention, a liner oxide layer 104 is deposited over the substrate 100 and the conducting structure 102. The liner oxide layer 104 is preferably silicon dioxide, has a thickness of about 300 to 800 angstroms, and is preferably formed using a conventional plasma-enhanced chemical vapor deposition (PECVD) technique. The liner oxide layer 104 serves the purpose of providing a high quality insulator directly over and in immediate contact with the conducting structure.

Next, a first layer of low k dielectric material 106 is coated onto the liner oxide layer 104 using conventional techniques. An example of a low k dielectric material is spin-on-glass (SOG). The first low k dielectric material layer 106 is preferably about 2000 to 8000 angstroms thick. The first low k dielectric material layer 106 is cured to reduce moisture absorption during subsequent stripping of a photoresist layer used in subsequent masking and etching of oxide layers and to remove solvent in the SOG film. The curing process is well-known, and thus, will not be discussed further herein.

An insulating layer 108 (referred to as a cap oxide) is formed atop the first low k dielectric layer 106. The cap oxide layer 108 is preferably silicon dioxide and is formed using a plasma enhanced chemical vapor deposition (PECVD) technique. The cap oxide layer 108 preferably has a thickness of between 4000 and 7000 angstroms. Optionally, the cap oxide layer 108 is planarized in order to provide for global planarization. The planarization is preferably performed using a chemical mechanical polishing (CMP) process.

Next, a first nitride layer 110 is formed over the cap oxide layer 108. Preferably, the first nitride layer 110 is approximately 500 to 1500 angstroms and formed by a PECVD technique. Further, the first nitride layer is typically formed from silicon nitride ($Si_3N_4$).

Then, a first photoresist layer 112 is coated onto the first nitride layer 110 and developed to include a contact 114. The photoresist layer 112 has a pattern that coincides with the desired contact location.

Figure 2:
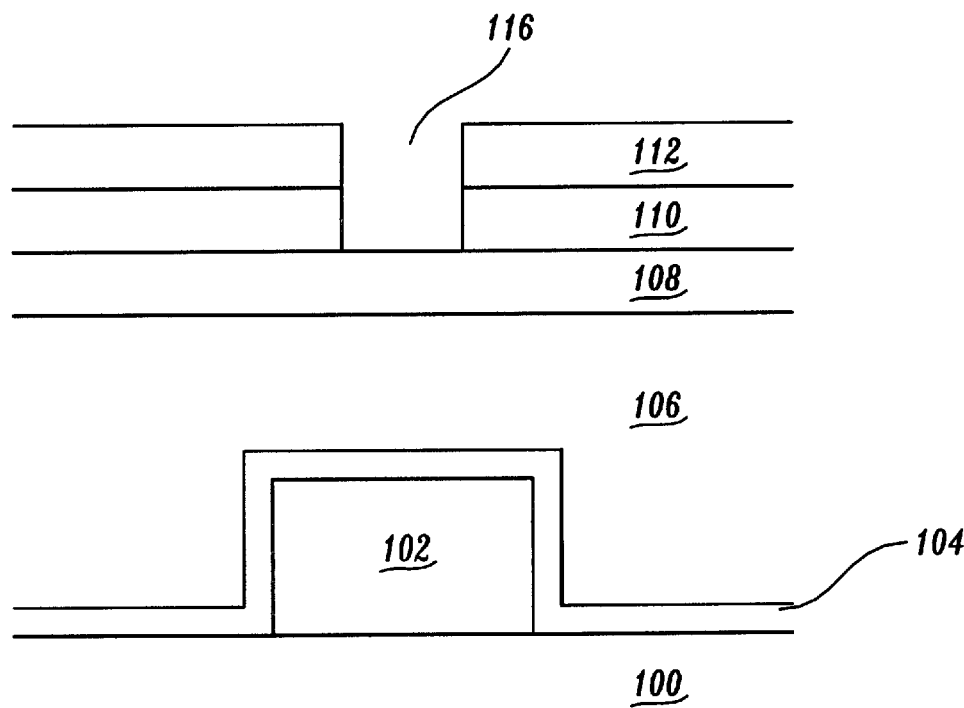

Turning to FIG. 2, a contact opening 116 is then formed in the first nitride layer 110. Note that the contact opening 116 is preferably of cylindrical shape, although may be formed into any desired shape. The photoresist layer 112 is used as a mask while etching the first nitride layer 110.

Turning to FIG. 3, the first photoresist layer 112 is stripped. A second layer of low k dielectric material 118 is deposited into the contact opening 116 and onto the first nitride layer 110 using conventional techniques, such as a spin on glass (SOG) coater. The second low k dielectric material layer 118 is preferably about 2000 to 8000 angstroms thick. The second low k dielectric material layer 118 is cured to reduce moisture absorption during subsequent stripping of a photoresist layer used in subsequent masking and etching of oxide layers and to remove solvent in the SOG film.

Next, a second nitride layer 120 is deposited onto the second low k dielectric layer 118. The second nitride layer 120 is preferably about 1500 angstroms thick and is preferably silicon nitride ($Si_3N_4$) deposited by a conventional PECVD process.

Then a second photoresist layer 122 is coated onto the second nitride layer 120. The second photoresist layer is patterned and developed to expose a trench opening 124.

Turning to FIG. 4, a dual damascene opening 126 is then formed by etching the liner oxide 104, the first low k dielectric layer 106, the cap oxide layer 108, the second low k dielectric layer 118, and the second nitride layer 120. The second low k dielectric layer 118 and the second nitride layer 120 are etched by using the second photoresist layer 122 as a mask and the first nitride layer 110 as an etching stop. The first low k dielectric layer 106, the liner oxide 104 and the cap oxide layer 108 are etched by using the first nitride layer 110 as a mask and the conductive structure 102 as an etching stop.

Figure 5:
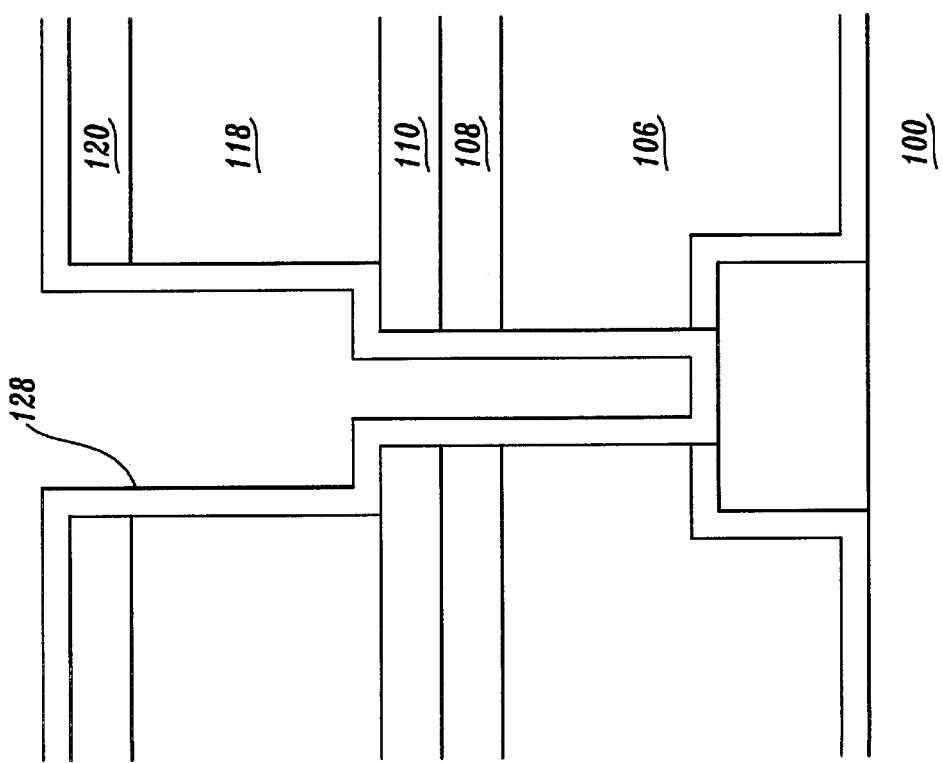

Turning to FIG. 5, the second photoresist layer 122 is stripped. A chemical vapor deposition (CVD) oxide layer 128 is deposited into the dual damascene opening 126 and atop the second nitride layer 120. Preferably, the CVD oxide layer 128 is high density plasma (HDP) oxide. The CVD oxide layer 128 preferably has a thickness of between 300 and 1000 angstroms.

Figure 6:
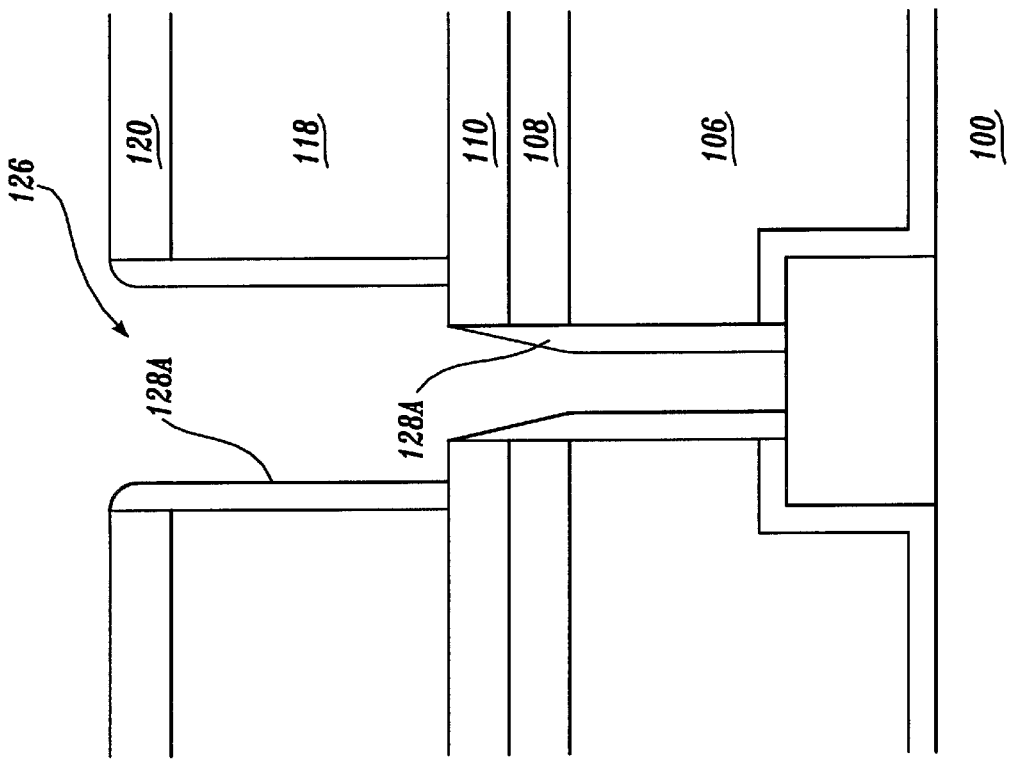

Turning to FIG. 6, the CVD oxide 128 is etched (such as by reactive ion etching) to form CVD oxide spacers 128a along the sidewalls of the dual damascene opening 126. The CVD oxide spacers 128a prevent outgassing from the first low k dielectric layer 106 and the second low k dielectric layer 108.

The dual damascene contact is thereby complete. A conductive layer is then deposited to form the metal interconnect structure. This step is well-known in the art and will not be discussed further herein.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a dual damascene metal interconnect and via structure over a substrate, the method comprising the steps of:
    forming a first oxide layer onto said substrate;
    forming a first nitride layer atop said first oxide layer;
    patterning and etching said first nitride layer to form a contact opening;
    forming a second oxide layer into said contact opening and atop said first nitride layer;
    forming a photoresist layer atop said second oxide layer;
    patterning and developing said photoresist layer to expose a trench opening, wherein said trench opening is of different dimension than said contact opening;
    forming a dual damascene opening by etching said second oxide layer, using said photoresist layer as a mask, and by etching said first oxide layer, using said first nitride layer as a mask;
    stripping said photoresist layer;
    forming oxide sidewall spacers into said dual damascene opening; and
    depositing a conductive layer into said dual damascene opening.

2. The method of claim 1 wherein the step of forming said oxide sidewall spacers comprises:
    depositing a third oxide layer into said dual damascene opening; and
    etching back said third oxide layer.

3. The method of claim 1 further including the step of forming a second nitride layer between said second oxide layer and said photoresist layer.

4. The method of claim 3, wherein said first nitride layer and said second nitride layer are formed of silicon nitride ($Si_3N_4$).

5. The method of claim 1, wherein said first oxide layer is formed of a combination of a liner oxide layer, a low k dielectric layer and a cap oxide layer.

6. A method for forming a dual damascene structure on a substrate, the method comprising the steps of:
    forming a liner oxide onto said substrate;
    forming a first low k dielectric layer atop said liner oxide;
    forming a cap oxide layer atop said first low k dielectric layer;
    forming a first nitride layer atop said cap oxide layer;
    patterning and etching said first nitride layer to form a contact opening;
    forming a second low k dielectric layer into said contact opening and atop said first nitride layer;
    forming a photoresist layer atop said second low k dielectric layer;
    patterning and developing said photoresist layer to expose a trench opening, wherein said trench opening is of different dimension than said contact opening;
    forming a dual damascene opening by etching said second low k dielectric layer, using said photoresist layer as a mask, and by etching said cap oxide layer, said first low k dielectric layer and said liner oxide, using said first nitride layer as a mask;
    stripping said photoresist layer;
    forming oxide sidewall spacers into said dual damascene opening; and
    depositing a conductive layer into said dual damascene opening.

7. The method of claim 6 further including the step of curing said first and said second low k dielectric layer.

8. The method of claim 6 further including the step of forming a second nitride layer between said second low k dielectric layer and said photoresist layer.

9. The method of claim 8, wherein said first nitride layer and said second nitride layer are formed of silicon nitride.

10. The method of claim 6, wherein said cap oxide layer is formed of silicon dioxide.

11. The method of claim 6, wherein said oxide sidewall spacers is high density plasma (HDP) oxide sidewall spacers.

* * * * *